United States Patent
Chiu et al.

(10) Patent No.: US 10,269,948 B2
(45) Date of Patent: *Apr. 23, 2019

(54) HIGH-ELECTRON-MOBILITY TRANSISTOR (HEMT) STRUCTURE CAPABLE OF PROTECTING A III-V COMPOUND LAYER AND MANUFACTURING METHOD THEREOF

(71) Applicant: TAIWAN SEMICONDUCTOR MANUFACTURING COMPANY LTD., Hsinchu (TW)

(72) Inventors: Han-Chin Chiu, Kaohsiung (TW); Sheng-De Liu, Taoyuan County (TW); Yu-Syuan Lin, Changhua County (TW); Yao-Chung Chang, Hsinchu County (TW); Cheng-Yuan Tsai, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/944,345

(22) Filed: Apr. 3, 2018

(65) Prior Publication Data

US 2018/0226501 A1 Aug. 9, 2018

Related U.S. Application Data

(62) Division of application No. 15/072,992, filed on Mar. 17, 2016, now Pat. No. 9,941,398.

(51) Int. Cl.
*H01L 29/205* (2006.01)
*H01L 29/778* (2006.01)
*H01L 29/66* (2006.01)
*H01L 29/20* (2006.01)

(52) U.S. Cl.
CPC ........ *H01L 29/7784* (2013.01); *H01L 29/205* (2013.01); *H01L 29/66462* (2013.01); *H01L 29/7783* (2013.01); *H01L 29/2003* (2013.01)

(58) Field of Classification Search
CPC ......... H01L 29/66431; H01L 29/66462; H01L 29/7784; H01L 29/7783; H01L 29/7782; H01L 29/7787; H01L 2924/13064
See application file for complete search history.

(56) References Cited

U.S. PATENT DOCUMENTS

| | | | | |
|---|---|---|---|---|
| 5,283,448 A | * | 2/1994 | Bayraktaroglu | H01L 21/28575 257/192 |
| 9,941,398 B2 | * | 4/2018 | Chiu | H01L 29/7784 |

\* cited by examiner

*Primary Examiner* — Andrew Q Tran
(74) *Attorney, Agent, or Firm* — WPAT, P.C., Intellectual Property Attorneys; Anthony King

(57) ABSTRACT

A semiconductor structure includes a semiconductive substrate having a top surface, a III-V compound layer covering the top surface, and a passivation layer having a lower portion and an upper portion, both comprising at least one of oxide and nitride over the III-V compound layer. The semiconductor structure also includes an etch stop layer between the lower portion and the upper portion of the passivation layer, and a gate stack penetrating through the etch stop layer and landing on the lower portion of the passivation layer. The gate stack is surrounded by the etch stop layer.

31 Claims, 14 Drawing Sheets

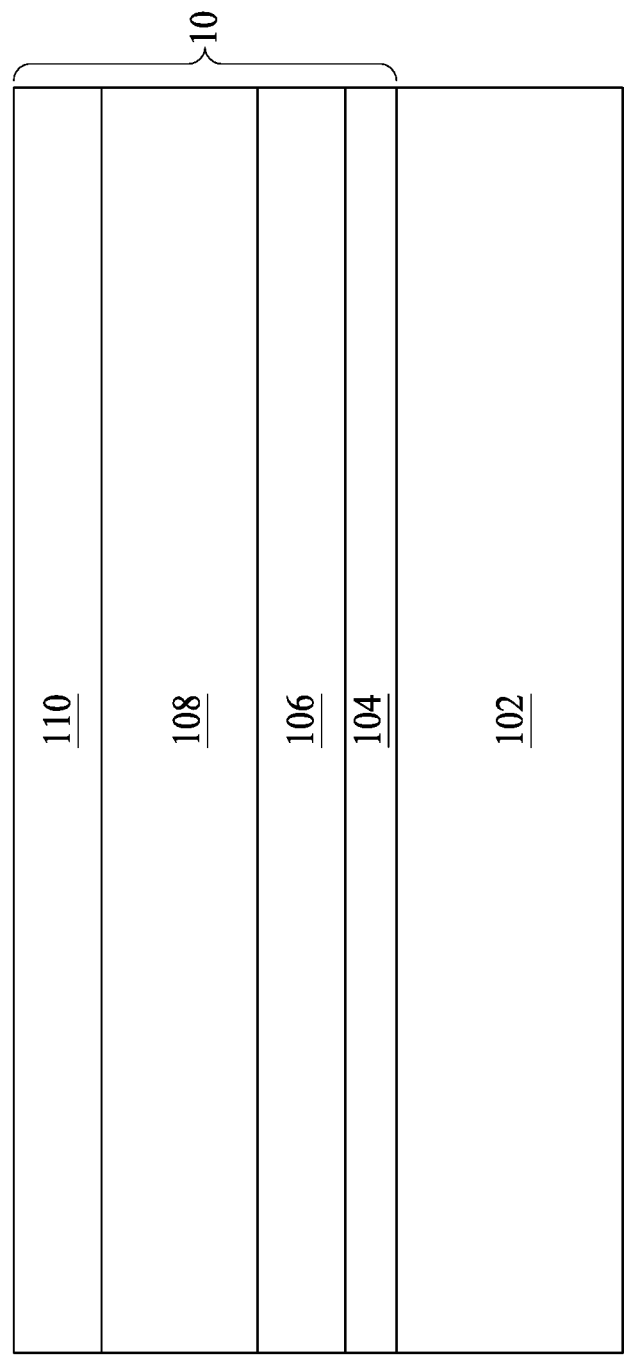

HIGH-ELECTRON-MOBILITY TRANSISTOR (HEMT) STRUCTURE CAPABLE OF PROTECTING A III-V COMPOUND LAYER AND MANUFACTURING METHOD THEREOF

PRIORITY CLAIM AND CROSS-REFERENCE

This application is a divisional application of U.S. patent application Ser. No. 15/072,992 filed Mar. 17, 2016, which is incorporated herein by reference in its entirety.

BACKGROUND

A High-electron-mobility transistor (HEMT), also known as hetero-structure FET (HFET) or modulation-doped FET (MODFET) incorporates a junction between two materials with different band gaps (i.e. a heterojunction) as a channel instead of a doped region as in most of metal-oxide-semiconductor field-effect transistor (MOSFET). HEMTs are capable of operating at high frequencies up to millimeter wave frequencies, and are used in high-frequency products.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2M are schematic views of manufacturing a semiconductor structure in accordance with some embodiments of the present disclosure.

DETAILED DESCRIPTION

Figure 1:
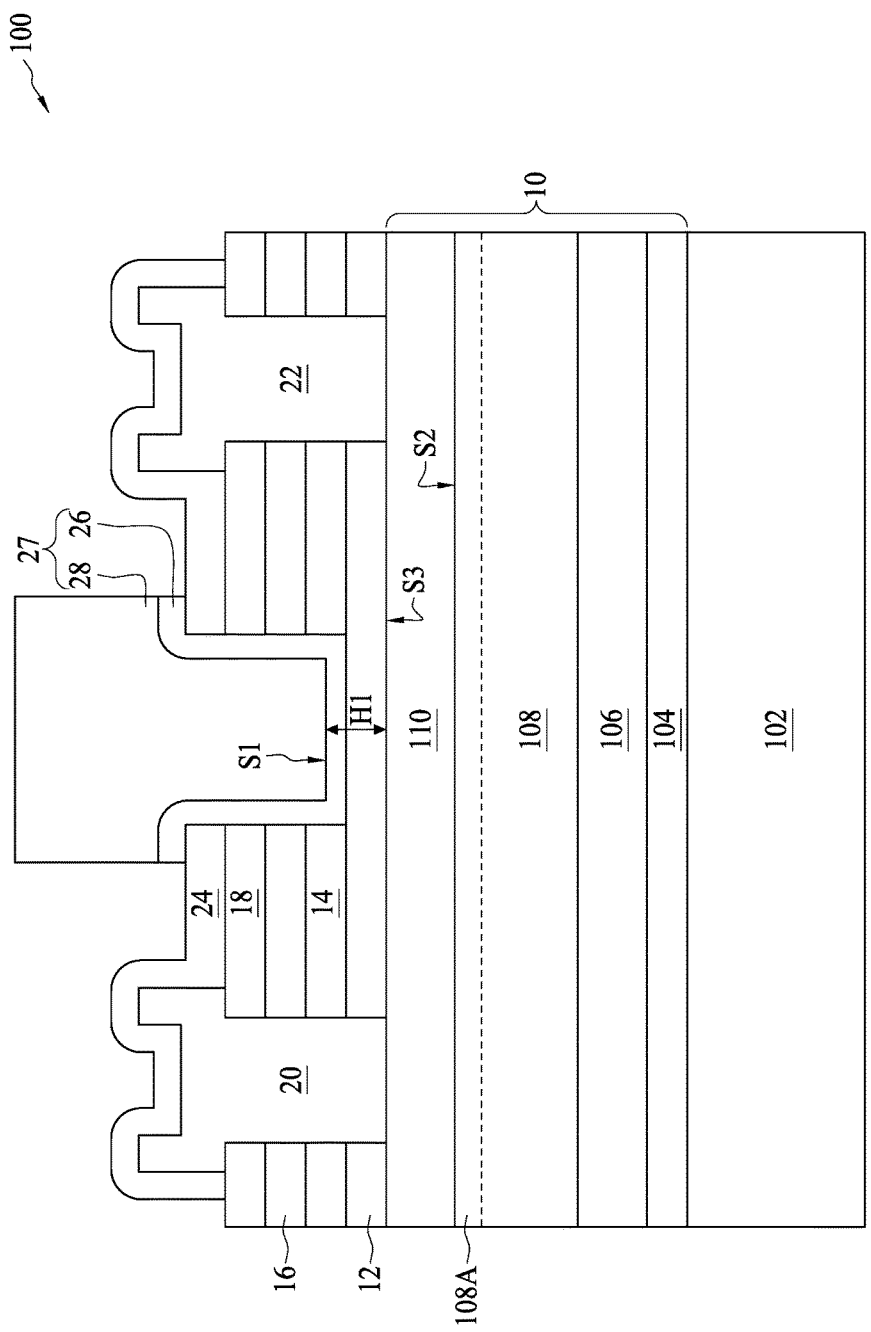
FIG. 1 is a schematic view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An HEMT on silicon substrates is commonly used as power switching transistors for voltage converter applications. Compared to silicon power transistors, HEMTs feature low on-state resistances, and low switching losses due to wide bandgap properties.

The performance of HEMTs relies on the properties of its component layers through which channel current flows. For example, HEMTs usually require a compound layer made of group III and group V elements, such as gallium, in order to carry the channel current. The surface of such compound layer is critical to HEMTs and needs to be protected. A common protection approach for the compound layer surface is achieved by deposition of a passivation layer thereon. However, the protective passivation layer may be affected during a consequent operation. For example, a recess is usually formed through the passivation layer and reaches the surface of the compound layer in order to form a gate terminal. A portion of the passivation layer is etched away and the underlying compound layer surface is exposed accordingly. Therefore, the operations of deposition and etching for the passivation layer may deteriorate the property of the surface thereof in leading to high interfacial density of states or large amounts of interfacial traps. Thus, undesirable effects, such as degraded drain current, enlarged threshold voltage fluctuation, and increased off-current leakage, may be observed.

In the present disclosure a semiconductor structure is proposed where the component layer for carrying channel current of the HEMT is protected effectively. The surface of the compound layer is kept intact during the manufacturing process of HEMTs. Therefore, the electrical performance of HEMTs can be enhanced.

FIG. 1 shows a cross sectional view of a semiconductor structure 100 in accordance with some embodiments of the present disclosure. The semiconductor structure 100 can be a compound semiconductor device implementing HEMTs. Referring to FIG. 1, the semiconductor structure 100 comprises a semiconductive substrate 102, a channel layer 108, a donor-supply layer 110, a gate stack 27, a first passivation layer 12, an etch stop layer 14, a second passivation 16, and source/drain regions 20 and 22.

The semiconductive substrate 102 includes a semiconductor material such as silicon. In some embodiments, the semiconductive substrate 102 may include other semiconductor materials, such as silicon germanium, silicon carbide, gallium arsenide, sapphire or the like. In some embodiments, the semiconductive substrate 102 is a p-type semiconductive substrate (acceptor type) or n-type semiconductive substrate (donor type). Alternatively, the semiconductive substrate 102 includes another elementary semiconductor, such as germanium; a compound semiconductor including silicon carbide, arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the semiconductive substrate 102 is a semiconductor-on-insulator (SOI). In other alternatives, the semiconductive substrate 102 may include a doped epi layer, a gradient semiconductor layer, and/or a semiconductor layer overlying another semiconductor layer of a different type, such as a silicon layer on a silicon germanium layer.

The semiconductor device 100 also includes a number of layers over the semiconductive substrate 102. For example, the semiconductor device 100 may include a compound layer composed of group III and group V elements, termed as a III-V compound layer 10. In some embodiments, an epitaxial layer, such as a first buffer layer 106 is disposed over the semiconductive substrate 102. In some embodiments, the first buffer layer 106 includes nitrides, such as a III-nitride of group III and group V elements. For example, the first buffer layer 106 includes aluminum gallium nitride (AlGaN). In alternative embodiments, the first buffer layer 106 includes a phosphide, such as indium phosphide (InP). In some embodiments, the first buffer layer 106 has a thickness from about 200 nm to about 800 nm. In some embodiments, the first layer 106 has a thickness from about 400 nm to about 500 nm.

In some embodiments, the semiconductor structure 100 may include a second buffer layer 104 between the semiconductive substrate 102 and the first buffer layer 106. In some embodiments, the second buffer layer 104 may serve as a nucleation layer for the first buffer layer 104. In some embodiments, the second buffer layer 106 includes nitrides, such as a III-nitride of group III and group V elements. For example, the second buffer layer 106 includes aluminum nitride (AlN), in alternative embodiments, the second buffer layer 106 includes an arsenide, such as gallium arsenide (GaAs). In some embodiments, the second buffer layer 106 has a thickness from about 100 nm to about 600 nm. In some embodiments, the second buffer layer 106 has a thickness from about 300 nm to about 500 nm.

The channel layer 108 is disposed over the first buffer layer 106. In some embodiments, the channel layer 108 is disposed between the gate stack 27 and the semiconductive substrate 102. In some embodiments, the channel layer 108 may be formed over the first buffer layer 106 or directly on semiconductive substrate 102. In some embodiments, the channel layer 108 includes nitrides, such as a III-nitride of group III and group V elements. For example, the channel layer 108 includes GaN. In alternative embodiments, the channel layer 108 includes an arsenide, such as InAlAs. In some embodiments, the channel layer 108 has a thickness from about 10 nm to about 70 nm.

The donor-supply layer 110 is disposed over the channel layer 108. In some embodiments, the donor-supply layer 110 is an aluminum gallium nitride (AlGaN) layer. The donor-supply layer 110 has a formula of $Al_xGa_{(1-x)}N$, wherein x varies between about 10% and 100%. It has a thickness in a range from about 5 nanometers to about 50 nanometers. In other embodiments, the donor-supply layer 110 may include AlGaAs or AlInP. Referring to FIG. 1, the second buffer layer 106, the first buffer layer 104, the channel layer 108 and the donor-supply layer 110 are collectively formed as the III-V compound layer 10.

A band gap discontinuity exists between the donor-supply layer 110 and the channel layer 108. The electrons from a piezoelectric effect in the donor-supply layer 110 drop into the channel layer 108, creating a very thin layer of highly mobile conducting electrons in the channel layer 108. This thin layer is referred to as a two-dimensional electron gas (2-DEG), forming a carrier channel 108A. Referring to FIG. 1A, an interface S2 is defined between the channel layer 108 and the donor-supply layer 110. The carrier channel 108A of 2-DEG is located near the interface S2 of the donor-supply layer 110 and the channel layer 108. Thus, the carrier channel 108A has high electron mobility because the channel layer 108 is undoped or unintentionally doped, and electrons can move freely without collision or substantially reduced collision with impurities.

The first passivation layer 12 is disposed over the donor-supply layer 11. In some embodiments, the firs passivation layer 12 is disposed between the donor-supply layer 11 and the gate stack 27. In some embodiments, the first passivation layer 12 covers at least a portion of a top surface S3 of the donor-supply layer 110. The structural integrity at the surface S3 of the donor-supply layer 110 is critical to the performance of the semiconductor device 100. It is desired to control the property of the donor-supply layer 110 at the surface S3 during the formation and maintenance processes of the semiconductor device 100. In some embodiments, the first passivation layer 12 is in contact with the donor-supply layer 110 to protect the top surface S3 thereof. In addition, the first passivation layer 12 is kept protecting the surface S3 during the subsequently performed operations. Therefore, the risk of damaging the top surface S3 through the first passivation layer is effectively mitigated.

The first passivation layer 12 may comprise oxides or nitrides. In some embodiments, the first passivation layer 12 includes silicon oxides ($SiO_x$), silicon nitride ($SiN_x$), silicon oxynitride, carbon doped silicon oxide, carbon doped silicon nitride, carbon doped silicon oxynitride, zinc oxide, zirconium oxide, hafnium oxide, titanium oxide, or combinations thereof. In some embodiments, the first passivation layer 12 includes aluminum nitride (AlN).

The etch stop layer 14 is disposed over the first passivation layer 12. In some embodiments, the etch stop layer 14 is disposed between the first passivation layer 12 and the second passivation layer 16. In some embodiments, the etch stop layer 14 surrounds the gate stack 27 near the bottom of the gate stack 27. In some embodiments, the etch stop layer 14 surrounds the source/drain region 20 and 22. In some embodiments, a portion of the etch stop layer 14 between the bottom of the gate stack 27 and the first passivation layer 12 is removed such that the gate stack is in contact with the first passivation layer 12.

The etch stop layer 14 may comprised of dielectric materials such as oxides or nitrides. In some embodiments, the etch stop layer 14 may be formed of a different dielectric material from that of the first passivation layer 12 or the second passivation layer 16. In some embodiments, the etch stop layer 14 has an etching selectivity to the first passivation layer 12 or the second passivation layer 16 from about 10 to about 250. In some embodiments, the etch stop layer 14 has an etching selectivity to the first passivation layer 12 or the second passivation layer 16 from about 20 to about 200. In some embodiments, the etch stop layer 14 has an etching selectivity to the first passivation layer 12 or the second passivation layer 16 from about 30 to about 100.

In some embodiments, the etch stop layer 14 includes a high-k dielectric material. In some embodiments, the etch stop layer 14 includes aluminum oxide ($AlO_x$). In some embodiments, the etch stop layer 14 includes a dielectric layer made of an oxide of a material selected from at least one of Al, Hf, Ta, Nb, La, Ce, Sc, Mg, Ti, Sm, Gd, and Ga.

The etch stop layer 14 has a thickness determined based on the properties of the etch stop layer 14, the first passivation layer 12, as well as the second passivation layer 16. In some embodiments, the thickness of the etch stop layer 14 is determined to protect the first passivation layer 12 from being damaged when the second passivation layer 16 is being removed. Furthermore, in some embodiments, the thickness of the etch stop layer 14 is determined such that it can be removed within a predetermined duration in a subsequent operation. Therefore, a portion of the top surface S3 of the first passivation layer 12 is exposed without adversely affecting the property of the top surface S1 in some embodiments, the thickness of the etch stop layer 14 is from about 20 Å to about 800 Å. In some embodiments, the thickness of the etch stop layer 14 is from about 30 Å to about 500 Å. In some embodiments, the thickness of the etch stop layer 14 is from about 50 Å to about 200 Å.

The second passivation layer 16 is disposed over the etch stop layer 14. In some embodiments, the second passivation layer 16 is disposed between the etch stop layer 14 and a capping layer 18. In some embodiments, the etch stop layer 14 surrounds the a bottom portion of the gate stack 27. In some embodiments, the second passivation layer 16 surrounds the source/drain region 20 and 22.

The second passivation layer 16 may comprise oxides or nitrides. In some embodiments, the second passivation layer 16 includes silicon oxides ($SiO_x$), silicon nitride ($SiN_x$), silicon oxynitride, carbon doped silicon oxide, carbon doped silicon nitride, carbon doped silicon oxynitride, zinc oxide, zirconium oxide, hafnium oxide, titanium oxide, or combinations thereof. In some embodiments, the second passivation layer 16 includes aluminum nitride (AlN), in some embodiments, the second passivation layer 16 may comprise a material the same as or different from that of the first passivation layer 12.

The gate stack 27 is disposed over the first passivation layer 12. In some embodiments, the gate stack 27 is disposed over the donor-supply layer 110. The gate stack 27 may include one or many layers, in the present embodiments, the gate stack 27 comprises a gate dielectric 26 and a gate electrode 28. The gate dielectric 26 is disposed over the first passivation layer 12. In some embodiments, the gate dielectric 26 is in contact with the first passivation layer 12.

The gate dielectric 26 has a top surface S1 interfacing a bottom of the gate electrode 28. The first passivation layer 12 has a bottom surface S3 facing the donor-supply layer 110. A height H1 is measured from the surface S1 to the surface S3. The height H1 is designed in close relationship with the voltage bias of the HEMT. For example, the height H1 may be increased along with the threshold voltage of the semiconductor device 100. A proper range of the height H1 needs to take different factors into consideration. On one hand, as device geometry is sought to shrink in advanced nodes, the height H1 would be scaled down accordingly. On the other hand, the height H1 is determined so as to render sufficient protection and electrical insulation through the gate dielectric 26 and the first passivation layer 12. In some embodiments, the height H1 is determined to be from about 30 Å to about 500 Å for a semiconductor device having a threshold voltage from about −30 volts to about +5 volts.

In view of the above discussion, the thickness of the first passivation layer 12 is included in the height H1. In some embodiments, the first passivation layer 12 has a thickness from about 5 Å to about 100 Å. In some embodiments, the first passivation layer 12 has a thickness from about 10 Å to about 200 Å. In some embodiments, the first passivation layer 12 has a thickness from about 100 Å to about 200 Å. In addition, in some embodiments, the gate dielectric 26 has a thickness from about 25 Å to about 400 Å. In some embodiments, the gate dielectric 26 has a thickness from about 20 Å to about 300 Å.

Furthermore, the second passivation layer 16 is configured to combine with the first passivation layer 12 to form a composite protective layer in order to provide protection for the underlying layers, e.g., III-V compound layer. On one hand, the composite protective layer (including passivation layers 12 and 16) are determined as thick enough for rendering sufficient robustness against foreign stress. On the other hand, the resultant thickness is required to be scaled down along with the decreased device size. Further, the thickness of the second passivation layer 16 is determined based on the thickness of the composite passivation layer and that of the first passivation layer. In some embodiments, the second passivation layer 16 has a thickness from about 5 Å to about 1000 Å. In some embodiments, the second passivation layer 16 has a thickness from about 100 Å to about 3000 Å. In some embodiments, the second passivation layer 16 has a thickness from about 100 Å to about 200 Å.

The gate dielectric 26 may include a silicon oxide or silicon nitride layer. Alternatively, the gate dielectric 26 may optionally include a high-k dielectric material, silicon oxide, silicon nitride, silicon oxynitride, other suitable materials, or combinations thereof. The high-k material may be selected from metal oxides, metal nitrides, metal silicates, transition metal-oxides, transition metal-nitrides, transition metal-silicates, oxynitride of metals, metal aluminates, zirconium silicate, zirconium aluminate, hafnium oxide, or combinations thereof. Examples of high-k dielectric material includes $HfO_2$, HfSiO, HfSiON, HfZrO, LaO, BazrO, HfSiO, LaSiO, AlSiO, HfTaO, HfTiO, zirconium oxide, aluminum oxide, other suitable high-k dielectric materials, and/or combinations thereof. In some embodiments, the gate dielectric 26 may have a multilayer structure such as one layer of silicon oxide and another layer of high k material. The gate dielectric 26 may be formed over an interfacial layer by any suitable process.

The gate electrode 28 is disposed over the gate dielectric 26. In some embodiments, the gate dielectric 26 is disposed between the first passivation layer 12 and the gate electrode 28. The gate electrode is configured to receive a voltage bias and electrically couple with the carrier channel 108A. The current flowing through the carrier channel 108A is adjusted through the voltage bias of the gate electrode 28. The gate electrode 28 may include a poly silicon material or conductive material. In some embodiments, the conductive material may include a refractory metal or its compounds, e.g., tungsten (W), titanium nitride (TiN) and tantalum (Ta). Other commonly used metals in the conductive material include nickel (Ni) and gold (Au).

The source/drain (S/D) regions 20 and 22 are disposed over the donor-supply layer 110 to electrically connect to the carrier channel 108A. The source region and the drain region can be interchanged between regions 20 and 22. For example, the region labeled 20 may be used as a source region while the region labeled 22 may be used as a drain region, and vice versa. Each of the S/D regions 20 and 22 includes a corresponding intermetallic compound, in some embodiments, the intermetallic compound is embedded in the donor-supply layer 110 and may be further embedded in a top portion of the channel layer 108. In some embodiments, the intermetallic compound includes Al, Ti, or Cu. In some other embodiments, the intermetallic compound includes AlN, TiN, $Al_3Ti$ or AlTiN.

In some embodiments, the semiconductor device 100 may comprise a first capping layer 18 over the second passivation layer 16, in some embodiments, the first capping layer 18 serves as a sacrificial layer. In some embodiments, the first capping layer 18 surrounds the gate stack 27. In some embodiments, the first capping layer 18 surrounds the source/drain region 20 and 22.

The first capping layer 18 may comprise oxides or nitrides. In some embodiments, the first capping layer 18 includes silicon oxides ($SiO_x$), silicon nitride ($SiN_x$), silicon oxynitride, carbon doped silicon oxide, carbon doped silicon nitride, carbon doped silicon oxynitride, zinc oxide, zirconium oxide, hafnium oxide, titanium oxide, or combinations thereof. In some embodiments, the first capping layer 18 may comprise a material the same as or different from that of the first passivation layer 12 or the second passivation layer 16.

In some embodiments, the first capping layer 18 has a thickness from about 5 Å to about 2000 Å. In some embodiments, the first capping layer 18 has a thickness from about 10 Å to about 1000 Å. In some embodiments, the first capping layer 18 has a thickness from about 100 Å to about 200 Å.

In some embodiments, the semiconductor device 100 may comprise a second capping layer 24 over the first capping layer 18. In some embodiments, the second capping layer 24 serves as a sacrificial layer, in some embodiments, the second capping layer 24 surrounds the gate stack 2'7. In some embodiments, the second capping layer 24 covers the source/drain region 20 and 22.

The second capping layer 24 may comprised of oxides or nitrides. In some embodiments, the second capping layer 24 includes silicon oxides ($SiO_x$), silicon nitride ($SiN_x$), silicon oxynitride, carbon doped silicon oxide, carbon doped silicon nitride, carbon doped silicon oxynitride, zinc oxide, zirconium oxide, hafnium oxide, titanium oxide, or combinations thereof. In some embodiments, the second capping layer 24 may comprise a material the same as or different from that of the first capping layer 18, the first passivation layer 12 or the second passivation layer 16.

In some embodiments, the second capping layer 24 has a thickness from about 5 Å to about 2000 Å. In some embodiments, the second capping layer 24 has a thickness from about 10 Å to about 1000 Å. In some embodiments, the second capping layer 24 has a thickness from about 100 Å to about 200 Å.

Figure 2B:
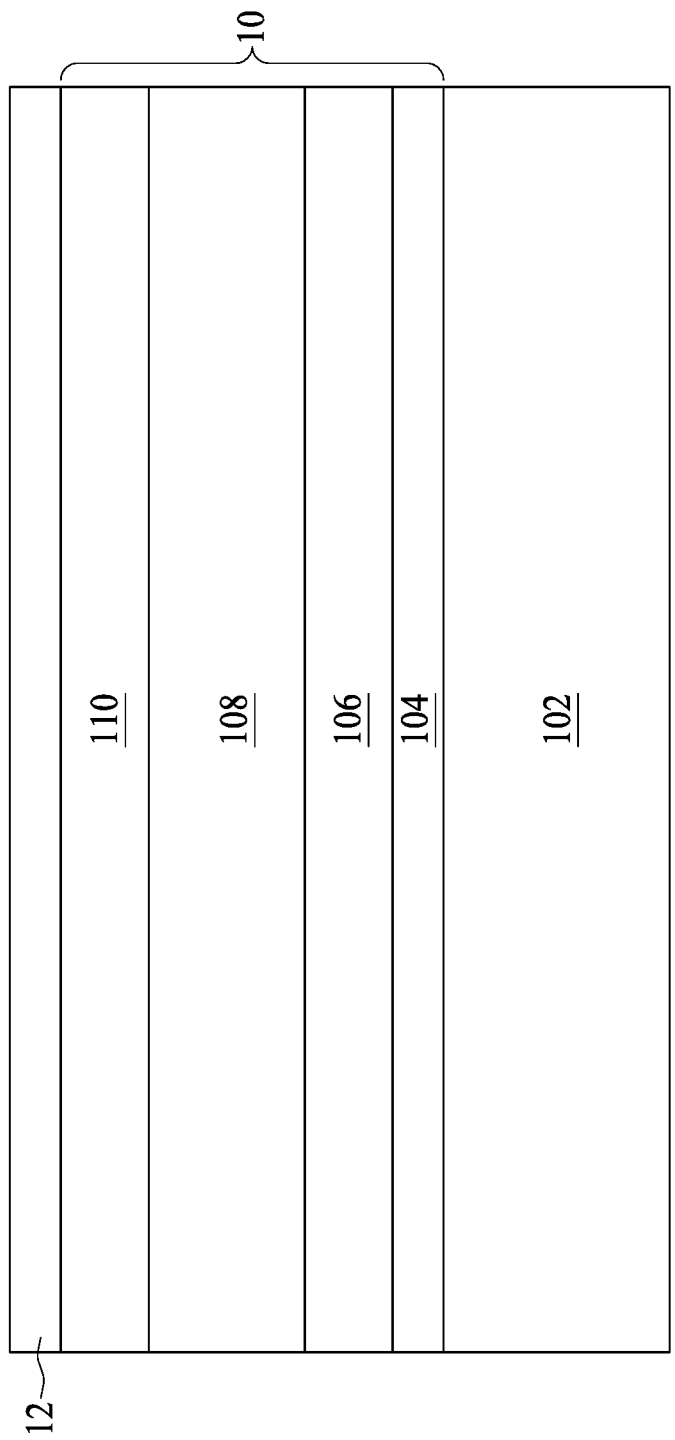

FIG. 2A to FIG. 2M show cross-sectional views of the semiconductor structure 100 of FIG. 1 fabricated at various stages, in accordance with some embodiments of the present disclosure. In FIG. 2A, a semiconductive substrate 102 is provided. The semiconductive substrate 102 may be undoped. In some embodiments, the semiconductive substrate 102 may include a first dopant type, such as a P-type.

In addition, the III-V compound layer 10 is provided or formed over the semiconductive substrate 102, in some embodiments, the III-V compound layer 10 includes a multilayer structure, which may comprise at least one of the second buffer layer 106, the first buffer layer 104, the channel layer 108 and the donor-supply layer 110. The aforesaid III-V layers may be grown in a form of epitaxial layer sequentially over the semiconductive substrate 102.

Referring to FIG. 2B, the first passivation layer 12 is formed over the III-V compound layer. In some embodiments, the first passivation layer 12 is formed over the donor-supply layer 110. In some embodiments, the first passivation layer 12 is in contact with the donor-supply layer 110. The first passivation layer 12 is blanket deposited on the donor-supply layer 110. The first passivation layer 12 may be formed by vapor deposition or spin coating. "Vapor deposition" refers to processes of depositing materials on a substrate though the vapor phase. Vapor deposition processes include any process such as, but not limited to, chemical vapor deposition (CVD) and physical vapor deposition (PVD). Examples of vapor deposition methods include hot filament CVD, radio-frequency CVD (rf-CVD), laser CVD (LCVD), conformal diamond coating processes, metal-organic CVD (MOCVD), sputtering, thermal evaporation PVD, electron beam PVD (EBPVD), reactive PVD, atomic layer deposition (ALD), plasma-enhanced CVD (PECVD), high-density plasma CVD (HDPCVD), low-pressure CVD (LPCVD) and the like.

Figure 2C:
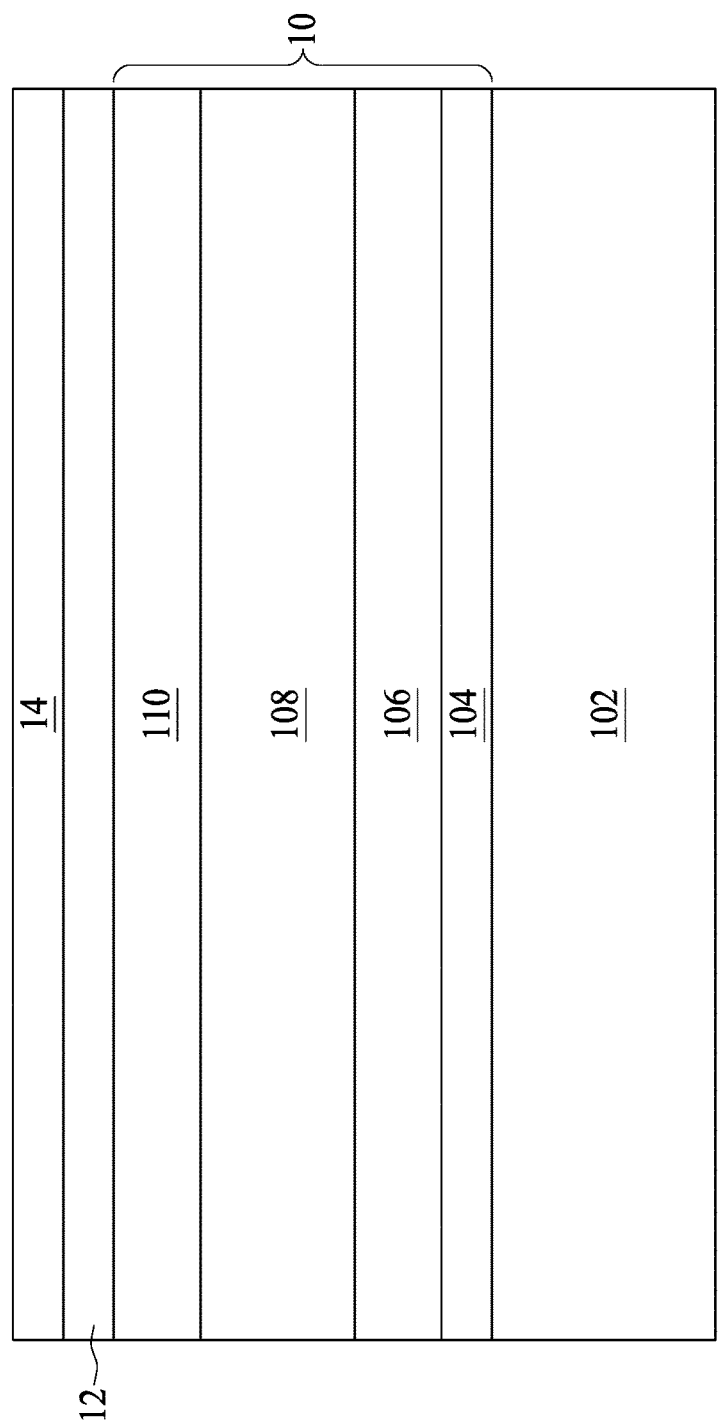
Figure 2D:
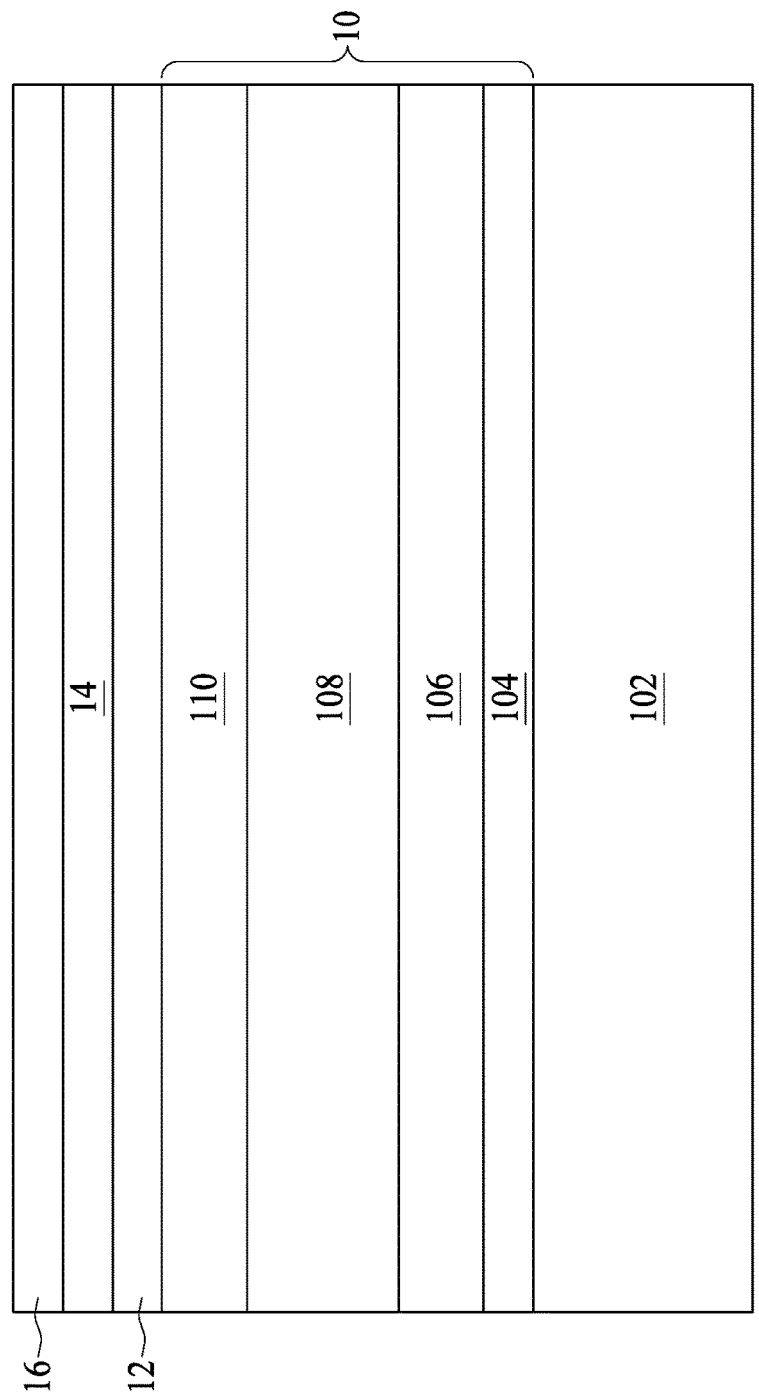
Figure 2E:
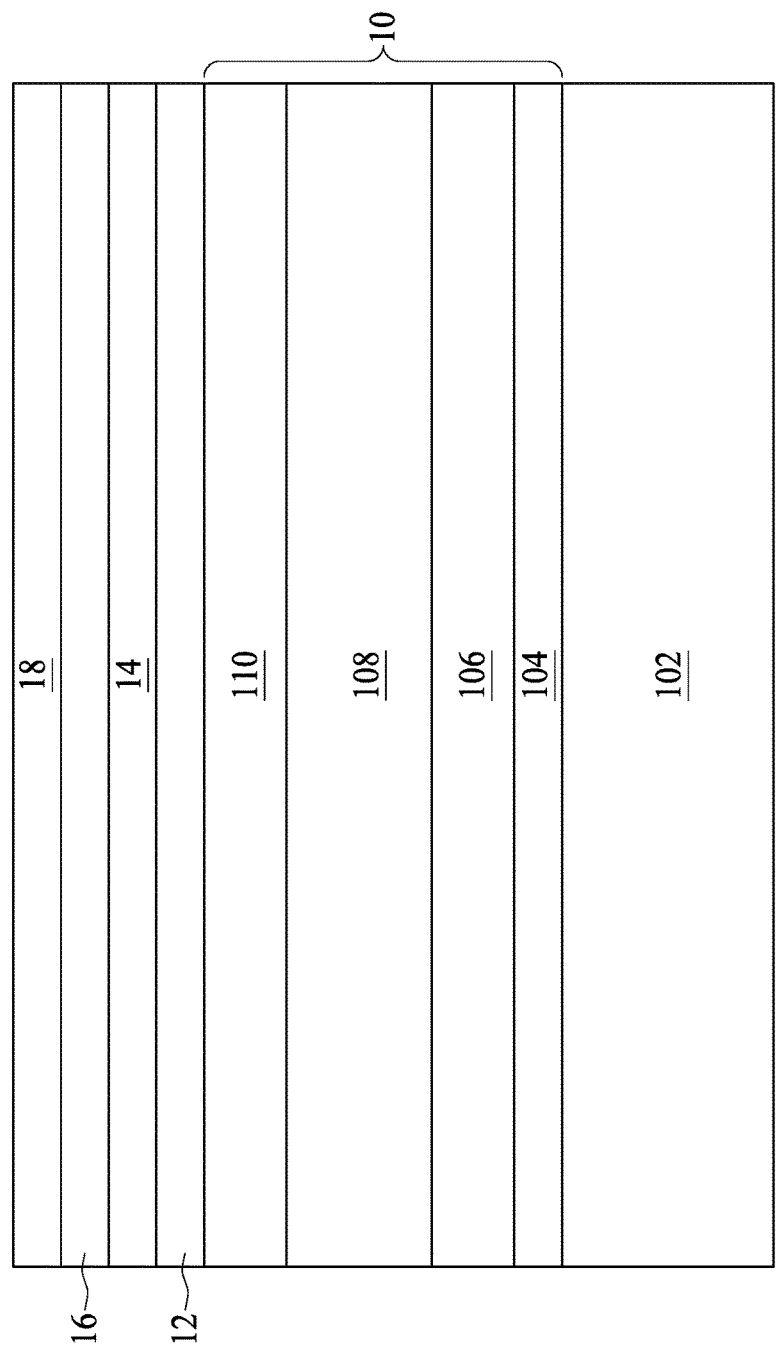

FIGS. 2C-2E show cross-sectional views of the semiconductor structure 100 of FIG. 1 with respect to the formation of the etch stop layer 14, the second passivation 16 and the first capping layer 18. The aforesaid layers 14, 16 and 18 are blanket deposited over the first passivation layer 12 in sequence. The deposition process for the layers may include CVD and PVD processes. Examples of vapor deposition methods include hot filament CVD, rf-CVD, LCVD, conformal diamond coating processes, MOCVD, sputtering, thermal evaporation PVD, EBPVD, reactive PVD, ALD, PECVD, HDPCVD, LPCVD and the like.

Figure 2F:
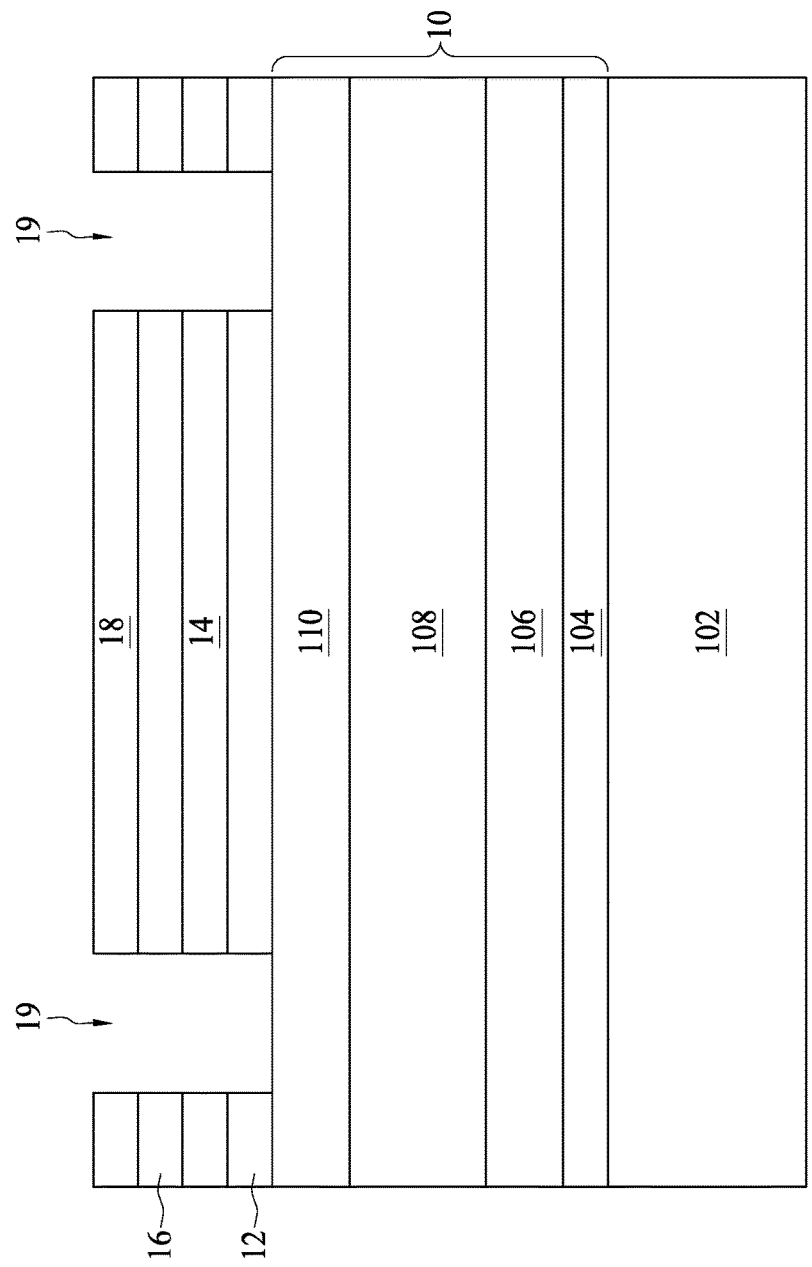

In FIG. 2F, trenches 19 are formed over the III-V compound layer 10. The trenches 19 are formed to penetrate through the first passivation layer 12, the etch stop layer 14, the second passivation layer 16 and the first capping layer 18. The trenches 19 may be formed by deposition of a mask layer. The mask layer can be a photoresist mask or hard mask, such as nitride. Then, an etching operation is performed with the mask layer in place. The trenches 19 are then formed by a suitable etching process, such as a dry etch operation. In some embodiments, the dry etch in the present operation includes a reactive ion etch (RIE) adopting fluorine-containing gases. The mask layer is removed after the trenches 19 are completed.

Figure 2G:
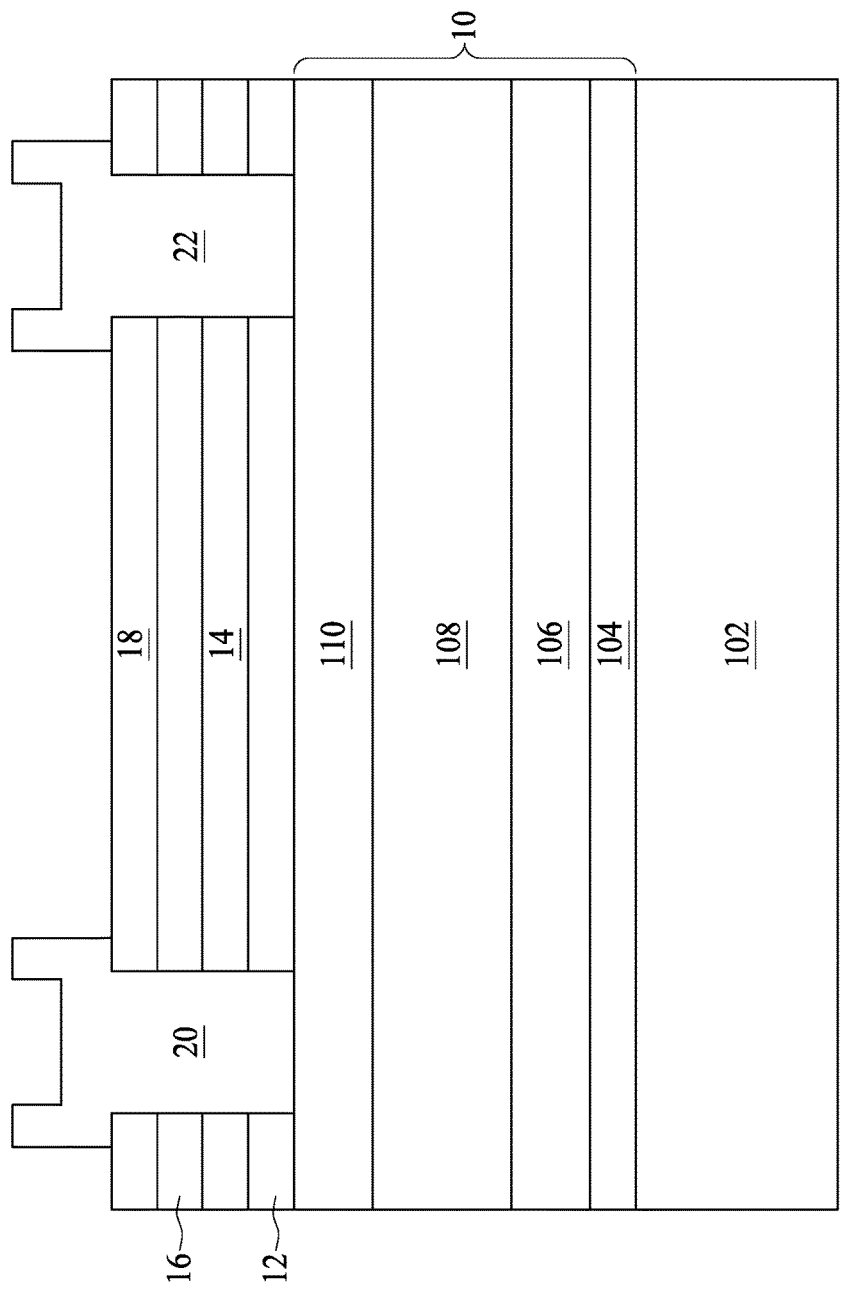

Referring to FIG. 2G, S/D regions 20 and 22 are formed in the trenches 19. In some embodiments, the S/D regions 20 and 22 are surrounded by the first passivation layer 12, the etch stop layer 14, the second passivation layer 16, and the first capping layer 18 laterally. In some embodiments, the S/D regions 20 and 22 protrude from the first capping layer 18. The source region 20 and the drain region 22 may be formed by a by a variety of techniques, e.g., electroplating, electroless plating, high-density ionized metal plasma (IMP) deposition, high-density inductively coupled plasma (ICP) deposition, sputtering, PVD, CVD, LPCVD, PECVD, ALD, and the like.

Figure 2H:
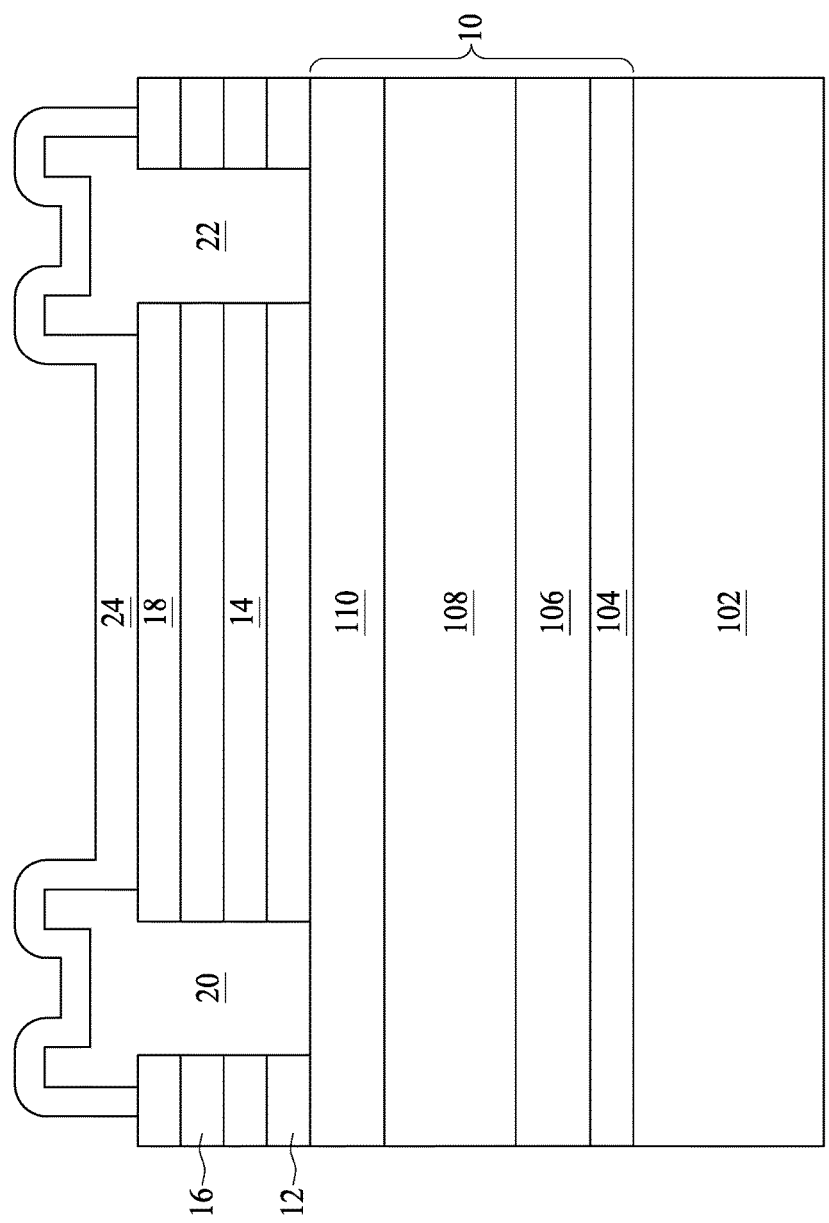

In FIG. 2H, the second capping layer 24 is blanket deposited over the first capping layer 18. In some embodiments, the second capping layer 24 covers the source region 20 and the drain region 22. The deposition process for the layers may include CVD and PVD processes. Examples of vapor deposition methods include hot filament CVD, rf-CVD, LCVD, conformal diamond coating processes, MOCVD, sputtering, thermal evaporation PVD, EBPVD, reactive PVD, ALD, PECVD, HDPCVD, LPCVD and the like.

Figure 2I:
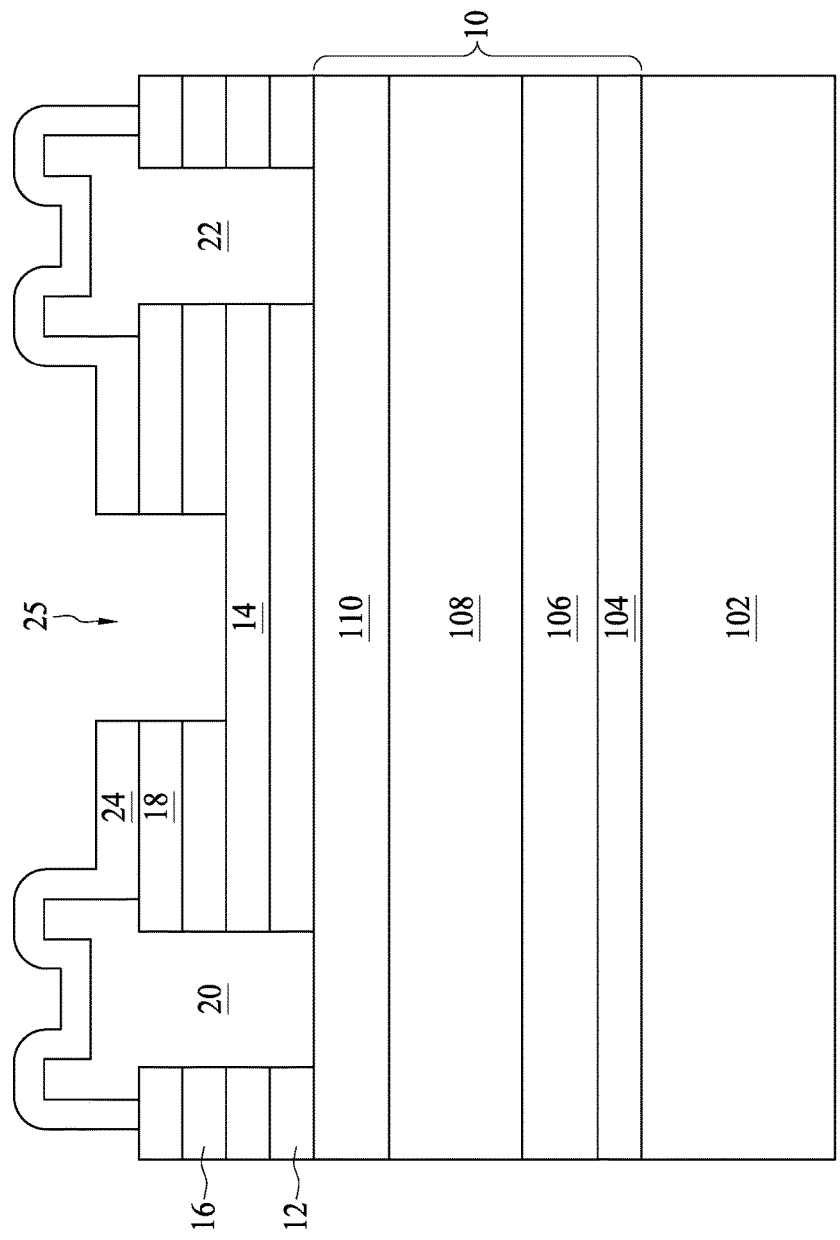

As illustrated in FIG. 2I, a recess 25 is formed between the source region 20 and the drain region 22. The recess 25 penetrates the second capping layer 24, the first capping layer 18 and the second passivation layer 16. Further, the recess 25 exposes a portion of the etch stop layer 14. The recess 25 may be formed by deposition of a mask layer. The mask layer can be a photoresist mask or hard mask, such as nitride. Then, an etching operation is performed with the mask layer in place. The recess 25 is then formed by a suitable etching process, such as a dry etch operation. In some embodiments, the dry etch in the present operation includes a reactive ion etch (RIE) adopting fluorine-containing gases. The mask layer is removed after the recess 25 is completed.

Figure 2J:
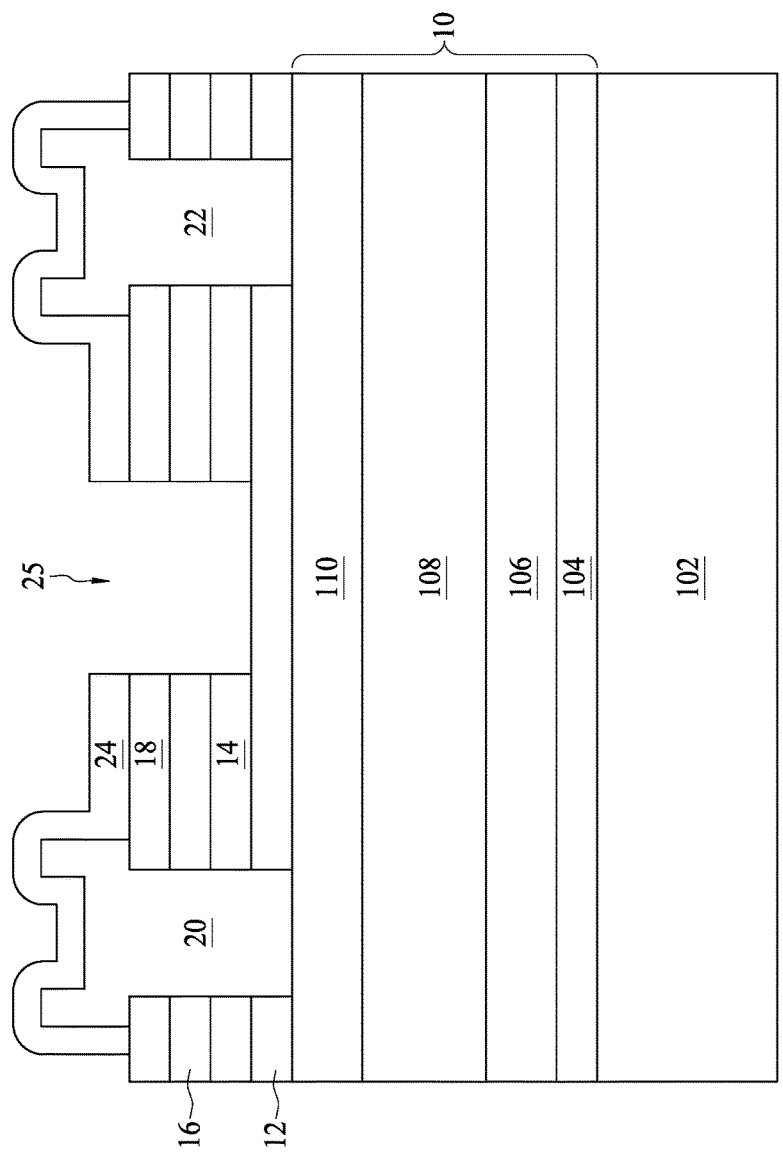

Referring to FIG. 2J, the recess 25 is etched a step further down to the first passivation layer. In some embodiments, the recess 25 penetrates through the etch stop layer 14 and exposes a portion of the first passivation layer 12. In some embodiments, the etching operation against the etch stop layer 14 may be performed by a removing process, such as a wet etch dipping operation. In some embodiments, the wet etch dipping operation is conducted under a time mode where the etch depth is estimated in terms of etch time. The wet etch dipping operation may be performed using a suitable etching solutions such as $NH_4OH$. In contrast to an RIE process which incorporates an ionic bombardment, the wet etch dipping process adopts a chemical approach to bring the etch stop layer 14 away. As discussed previously, the top surface S3 of the III-V compound layer 10 is prone to generate interfacial traps and needs protection of the first passivation layer 12 from being adversely affected. Since the first passivation layer 12 is kept intact during the process of wet etch dipping operation, the surface S3 is guarded effectively.

Further, the etch stop layer 14 is determined to provide sufficient etching selectivity to the neighboring layers, such as the firs passivation layer 12 and the second passivation layer 16, in order to achieve the purpose of keeping the first passivation layer 12 from being etched. In some embodiments, the etch stop layer 14 has an etching selectivity to silicon oxide or silicon nitride from about 10 to about 250. That is, by using a proper etchant, the etch stop layer 14 is consumed 10 to 250 times faster than the first passivation layer 12. In some embodiments, the etch stop layer 14 has an etching selectivity to silicon oxide or silicon nitride from about 20 to about 200. In some embodiments, the etch stop layer 14 has an etching selectivity to silicon oxide or silicon nitride from about 30 to about 100.

Figure 2K:
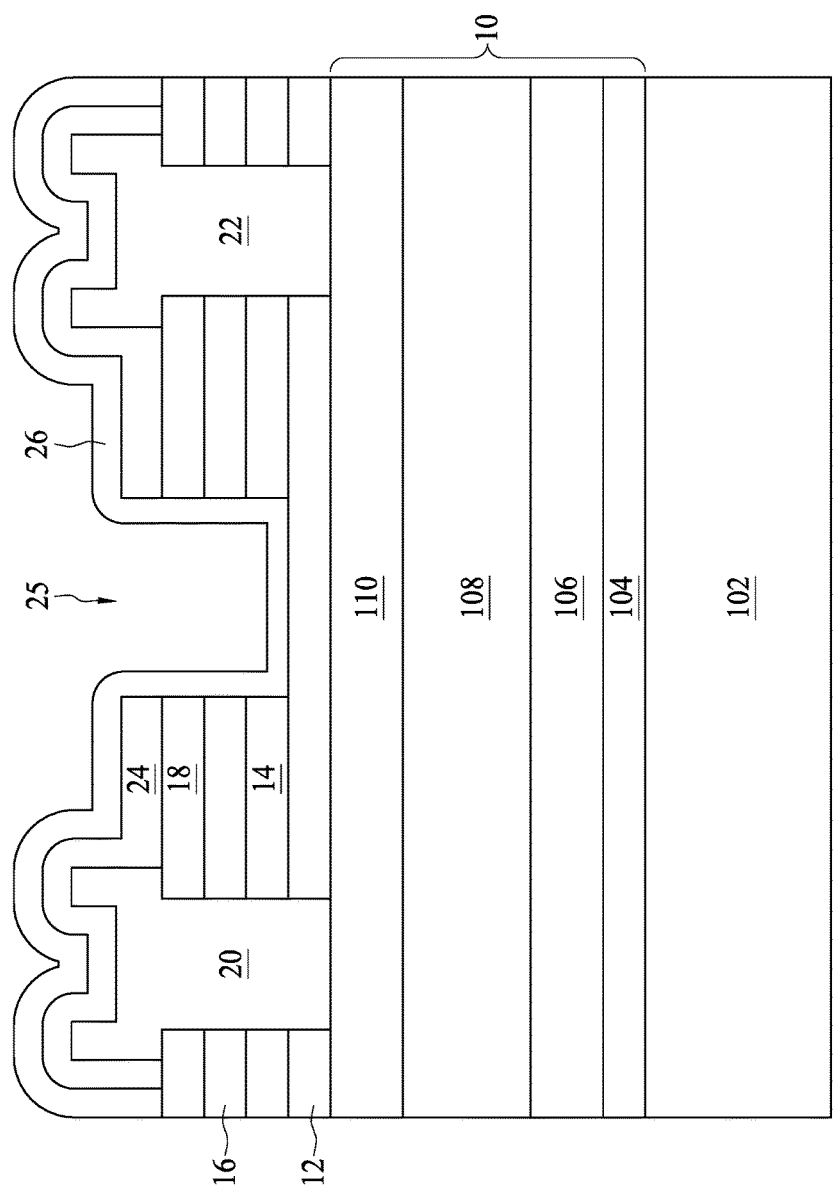

Then, the gate dielectric 26 is blanket deposited over the second capping layer 24 in FIG. 2K. The gate dielectric 26 is also lining alone a bottom side and sidewalls of the recess 25. The deposition process for the layers may include CVD and PVD processes. Examples of vapor deposition methods include hot filament CVD, rf-CVD, LCVD, conformal diamond coating processes, MOCVD, sputtering, thermal evaporation PVD, EBPVD, reactive PVD, ALD, PECVD, HDPCVD, LPCVD and the like.

In addition, as discussed previously, the thickness of the gate dielectric in conjunction with that of the first passivation layer 12 constitute the height H1. Therefore, the thickness of the gate dielectric plays an important role in the manufacturing of HEMTs. In some embodiments, the gate dielectric 26 includes a thickness from about 50 Å to about 500 Å. In some embodiments, the gate dielectric 26 includes a thickness from about 100 Å to about 500 Å.

Figure 2L:
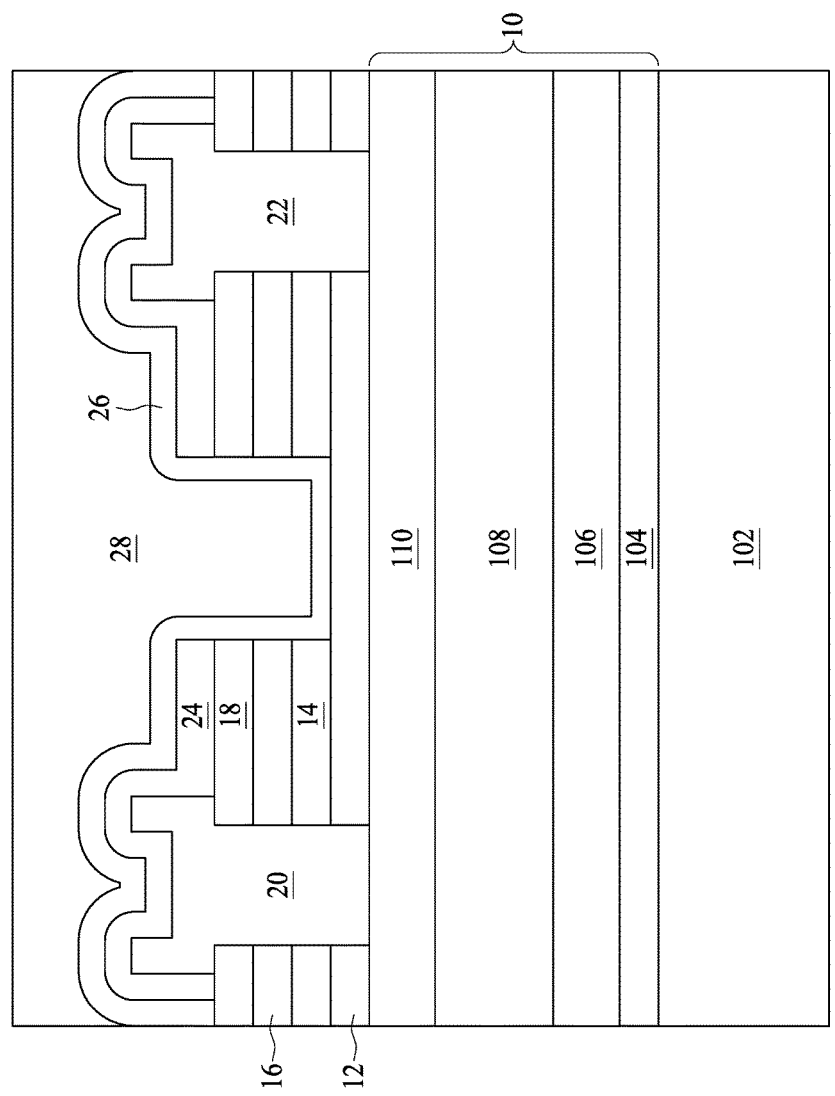

Referring to FIG. 2L, a gate electrode material 28 is deposited over the gate dielectric 26. The gate electrode material 28 also fills the recess 25. The gate electrode material 28 may be deposited by a by a variety of techniques, e.g., electroplating, electroless plating, high-density ionized metal plasma (IMP) deposition, high-density inductively coupled plasma (ICP) deposition, sputtering, PVD, CVD, LPCVD, PECVD, ALD, and the like.

Figure 2M:
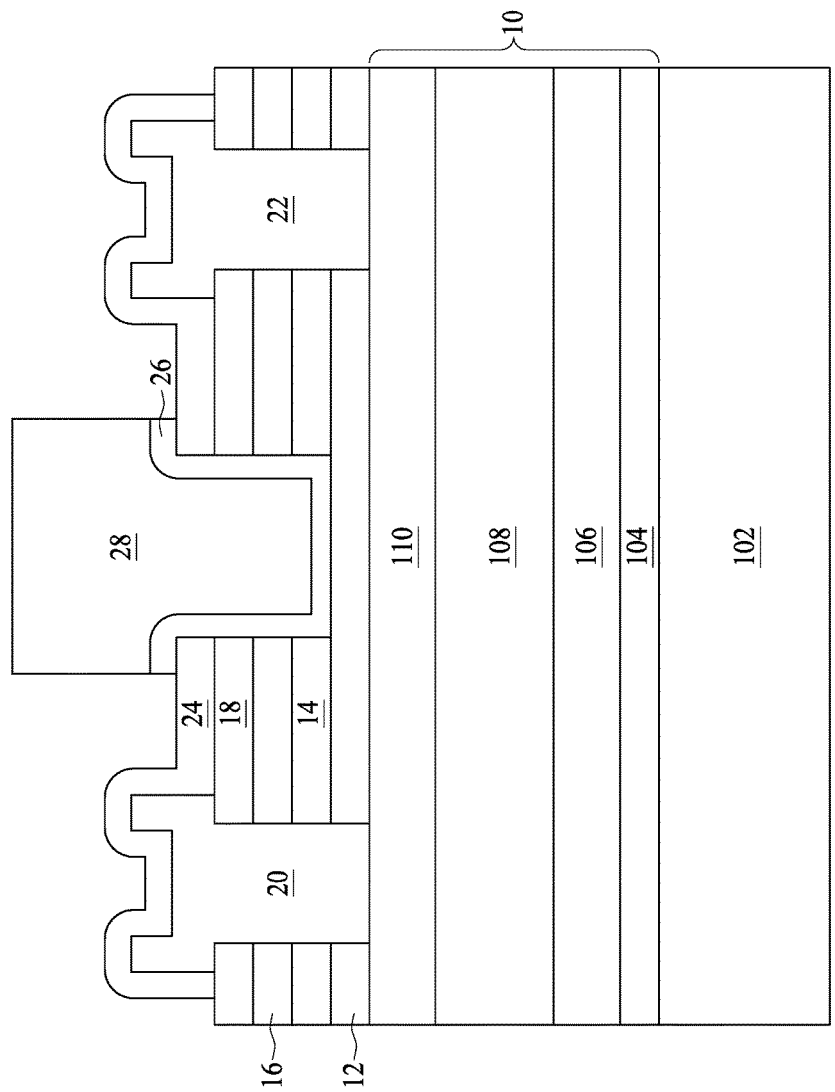

In FIG. 2M, the gate electrode 28 is patterned to form a gate electrode terminal. The gate electrode 28 may be patterned by deposition of a mask layer. Then, an etching operation is performed for removing portions other than the desired gate electrode terminal 28. In some embodiments, the etching operation may include a dry etch, such as a reactive ion etch (RIE) adopting fluorine-containing gases. The mask layer is removed after the gate electrode terminal 28 is formed.

The present disclosure provides a semiconductor structure. The semiconductor structure comprises a semiconductive substrate comprising a top surface, a III-V compound layer covering the top surface, and a passivation layer having a lower portion and an upper portion, both comprising at least one of oxide and nitride over the III-V compound layer. The semiconductor structure also includes an etch stop layer between the lower portion and the upper portion of the passivation layer, and a gate stack penetrating through the etch stop layer and landing on the lower portion of the passivation layer. The gate stack is surrounded by the etch stop layer.

The present disclosure provides a compound semiconductor device which includes a semiconductive substrate, a semiconductive donor-supply layer disposed over the substrate, a first passivation layer having at least one of oxide and nitride over the semiconductive donor-supply layer, a second passivation layer having at least one of oxide and nitride over the first passivation layer, a dielectric layer interfacing the first passivation layer and the second passivation layer, and a gate stack penetrating through the second passivation layer and the dielectric layer and landing on the first passivation layer. The gate stack is surrounded by the dielectric layer.

The present disclosure provides a semiconductor structure which includes a semiconductive substrate, a channel layer over the semiconductive substrate, a semiconductive donor-supply layer over the channel layer, a first passivation layer comprising at least one of oxide and nitride over the semiconductive donor-supply layer, an etch stop layer interfacing the first passivation layer and the second passivation layer, and a gate stack penetrating through the first passivation layer and the etch stop layer and landing on the first passivation layer. The gate stack is surrounded by the etch stop layer.

The present disclosure provides a method of manufacturing a semiconductor structure. The method comprises: providing a semiconductive substrate; forming a III-V compound layer over the semiconductive substrate; depositing a first passivation layer over the III-V compound layer; depositing an etch stop layer over the first passivation layer; forming a recess to expose the first passivation layer; and forming a gate stack in the recess.

The present disclosure provides a method of manufacturing a semiconductor structure. The method comprises: providing a semiconductive substrate; forming a III-V compound layer over the semiconductive substrate; depositing a first passivation layer over the III-V compound layer; depositing an etch stop layer over the first passivation layer; depositing a second passivation layer over the etch stop layer; performing a first etch on the second passivation layer to expose the etch stop layer; and performing a second etch on the etch stop layer, the second etch stopping on the first passivation layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a semiconductive substrate comprising a top surface;
a III-V compound layer covering the top surface;

a passivation layer having a lower portion and an upper portion, both comprising at least one of oxide and nitride over the III-V compound layer;
an etch stop layer between the lower portion and the upper portion of the passivation layer; and
a gate stack penetrating through the etch stop layer and landing on the lower portion of the passivation layer, gate stack being surrounded by the etch stop layer.

2. The semiconductor structure of claim 1, wherein the gate stack comprises a bottom surface in contact with the lower portion of the passivation layer.

3. The semiconductor structure of claim 1, wherein the etch stop layer is an oxide of a material selected from at least one of Al, Hf, Ta, Nb, La, Ce, Sc, Mg, Ti, Sm, Gd, and Ga.

4. The semiconductor structure of claim 1, wherein the upper portion of the second passivation layer surrounds the gate stack.

5. The semiconductor structure of claim 1, wherein the compound layer comprises an aluminum gallium nitride layer and an aluminum nitride layer.

6. The semiconductor structure of claim 1, further comprising a capping above the passivation layer and surrounding the gate stack.

7. A semiconductor structure, comprising:
a semiconductive substrate comprising a top surface;
a semiconductive donor-supply layer disposed over the substrate;
a first passivation layer comprising at least one of oxide and nitride over the semiconductive donor-supply layer;
a second passivation layer comprising at least one of oxide and nitride over the first passivation layer;
an etch stop layer interfacing the first passivation layer and the second passivation layer; and
a gate stack penetrating through the second passivation layer and the etch stop layer and landing on the first passivation layer, the gate stack being surrounded by the etch stop layer.

8. The semiconductor structure of claim 7, further comprising a source region and a drain region, the source region and the drain region being disposed over the semiconductive donor-supply layer and penetrating through the first passivation layer, the etch stop layer, and the second passivation layer.

9. The semiconductor structure of claim 8, further comprising a capping layer extended over the second passivation layer, the source region and the drain region, wherein the gate stack penetrates through the capping layer.

10. The semiconductor structure of claim 7, wherein the gate stack comprises a gate dielectric on a top surface of the first passivation layer.

11. The semiconductor structure of claim 10, wherein the etch stop layer and the second passivation layer surround the gate dielectric.

12. A compound semiconductor device, comprising:
a semiconductive substrate comprising a top surface;
a III-V compound layer over the semiconductive substrate;
a passivation layer having a lower portion and an upper portion, both comprising at least one of nitride and oxide over the III-V compound layer;
a dielectric layer between the lower portion and the upper portion of the passivation layer; and
a gate stack penetrating through the dielectric layer and landing on the lower portion of the passivation layer, the gate stack being surrounded by the dielectric layer.

13. The compound semiconductor device of claim 12, wherein the gate stack comprises a bottom surface in contact with the passivation layer.

14. The compound semiconductor device of claim 12, wherein the dielectric layer is an oxide of a material selected from at least one of Al, Hf, Ta, Nb, La, Ce, Sc, Mg, Ti, Sm, Gd, and Ga.

15. The compound semiconductor device of claim 12, wherein the passivation layer comprises nitrides.

16. The compound semiconductor device of claim 12, wherein the dielectric layer comprises a thickness from about 30 Å to about 500 Å.

17. The compound semiconductor device of claim 12, further comprising a capping layer above the passivation layer and surrounding the gate stack.

18. A method of manufacturing a semiconductor structure, comprising:
providing a semiconductive substrate;
forming a III-V compound layer over the semiconductive substrate;
depositing a first passivation layer comprising at least one of nitride and oxide over the III-V compound layer;
depositing an etch stop layer over the first passivation layer;
forming a recess to expose the first passivation layer; and
forming a gate stack in the recess.

19. The method of claim 18, wherein forming a recess to expose the first passivation layer comprises performing a wet etch dipping operation.

20. The method of claim 18, further comprising, before forming the recess to expose the first passivation layer, forming a second passivation layer over the etch stop layer.

21. The method of claim 18, wherein forming a gate stack in the recess further comprises:
depositing a gate dielectric layer along sidewalls and a bottom surface of the recess; and
forming a conductive material in the recess.

22. The method of claim 18, further comprising forming a source region and a drain region over the III-V compound layer and penetrating through the etch stop layer.

23. A method of manufacturing a semiconductor structure, comprising:
providing a semiconductive substrate;
forming a III-V compound layer over the semiconductive substrate;
depositing a first passivation layer over the III-V compound layer;
depositing an etch stop layer over the first passivation layer;
depositing a second passivation layer over the etch stop layer;
performing a first etch on the second passivation layer to expose a portion of the etch stop layer; and
performing a second etch on the exposed portion of the etch stop layer, the second etch stopping on the first passivation layer.

24. The method of claim 23, wherein the first etch comprises a reactive ion etch operation.

25. The method of claim 23, wherein the etch stop layer has an etching selectivity to silicon oxide or silicon nitride from about 10 to about 250.

26. The method of claim 23, further comprising forming a source region and a drain region, both extending in the second passivation layer, the etch stop layer and the first passivation.

27. The method of claim 23, further comprising forming a first capping layer over the second passivation layer, the first capping layer surrounding the gate stack.

28. The method of claim 27, further comprising forming a second capping layer over the first capping layer, wherein the gate stack penetrates through the second capping layer.

29. The method of claim 23, wherein at least one of the first passivation layer and the second passivation layer comprises at least one of nitride and oxide.

30. The method of claim 23, further comprising forming a gate dielectric on the exposed portion of the first passivation layer, filling a conductive material over the gate dielectric and patterning the conductive material into a gate electrode.

31. The method of claim 30, wherein a distance between a bottom surface of the gate electrode and a bottom surface of the first passivation layer is in a range between about 30 Å and about 500 Å.

* * * * *